US006797883B2

(12) United States Patent
Benson et al.

(10) Patent No.: US 6,797,883 B2
(45) Date of Patent: Sep. 28, 2004

(54) PROTECTIVE ELECTRICALLY INSULATING COVER WITH ACCESS DOOR

(75) Inventors: Thomas A. Benson, Fox Point, WI (US); Joseph E. Koziczkowski, Greendale, WI (US); Larry E. Quentin, Oak Creek, WI (US); Kathleen A. Schweitzer, Waukesha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 10/370,180

(22) Filed: Feb. 19, 2003

(65) Prior Publication Data

US 2004/0159457 A1 Aug. 19, 2004

(51) Int. Cl.[7] .................................................. H02G 3/14
(52) U.S. Cl. ............................. 174/66; 174/67; 220/241
(58) Field of Search ...................... 174/66, 67; 220/241, 220/242

(56) References Cited

U.S. PATENT DOCUMENTS

| 5,072,848 A | * | 12/1991 | Pipis et al. ................. 220/241 |
| 5,955,702 A | * | 9/1999 | Grossman et al. ............ 174/66 |
| 6,372,987 B1 | * | 4/2002 | Ha .............................. 174/67 |

OTHER PUBLICATIONS

Allen–Bradley, NEMA Combination Starters with Multi–Rated Type 3R/4/12 Enclosure for Rain–Resistant, Water–Tight, Dust Tight Applications booklet. Publication Dec. 2000.

* cited by examiner

Primary Examiner—Dhiru R Patel
(74) Attorney, Agent, or Firm—Quarles & Brady, LLP; Alexander M. Gerasimow

(57) ABSTRACT

An insulting cover for industrial control components employs a cover support that may simply attached to existing or specially prepared structures on the control component, which supports a door that may be opened or closed for access to the control component. A variety of different covers may be simply generated using CAD templates executed to cut sheets of plastic that may be formed with relatively simple and low cost techniques.

38 Claims, 3 Drawing Sheets

PROTECTIVE ELECTRICALLY INSULATING COVER WITH ACCESS DOOR

CROSS-REFERENCE TO RELATED APPLICATIONS

—

STATEMENT REGARDING FEDERALLY SPONSORED RESEARCH OR DEVELOPMENT

—

BACKGROUND OF THE INVENTION

The present invention relates generally to industrial control components such as fuse blocks and electrical disconnects as may be panel mounted, and in particular to a protective cover for these components.

Industrial control electrical equipment including components such as fuse blocks, electrical disconnects, and contactors, are typically mounted on a panel with interconnecting wiring run point-to-point between terminals on these devices. The mounting panel may be enclosed within a cabinet and the cabinet may have a door that may be closed to reduce the chance of accidental contact with the terminals and wiring of the components. The cabinet door may have an interlock, for example, working with the electrical disconnect to remove power from the components and wiring when the door is opened. However, often, an electrical interlock is not installed.

During testing and routine maintenance of the components and wiring within a cabinet, it may be necessary to have the cabinet door open while the wiring is live. For example, it may be desired to perform infrared thermography on the operating components to check for hot spots while power is applied. Alternatively, it may be necessary to probe voltages at points on the components while they are operating or to verify if fuses have blown. It may also be necessary to verify tightening torque at the termination points or electrical connections In these situations, it is known that providing a secondary insulating cover over individual components to minimize the opportunity for inadvertent contact with electricity when the cabinet door is open is desirable. Such secondary covers may, for example, be molded of an insulating plastic or constructed of cardboard and may attach to the particular component by hooks or tabs or screws or other means.

One problem with these individual insulating covers is that they are not always replaced, particularly in circumstances where repeated access to the component is required. Removal and installation of the cover may be difficult requiring a removal of power and then a reapplication of power before the testing is performed. In components that may have multiple sizes as mounted on a panel, for example, an electrical disconnect with a trailing fuse block accommodating different sizes of fuses, providing covers is cumbersome and costly. Covers that are optional for a component, and thus purchased in small quantities, make special plastic molds impractical, yet inexpensive covers manufactured of paper or the like may not be suitable for the purpose or sufficiently durable.

SUMMARY OF THE INVENTION

The present invention provides a transparent cover that may be attached to individual panel-mounted electrical components and that may be readily manufactured from standard plastic sheet using simple folding operations. The cover has a door that may be opened for access to the components, simplifying such access and eliminating the problem of the cover being misplaced or removed entirely. The cover is suitable for components of varied sizes and shapes and having different available attachment points. A wide variety of cover plates may be manufactured in small quantities using stored computer-aided machining (CAM) files to cut the plastic sheet prior to folding.

Specifically, the present invention provides a cover system for electrical control components comprising an electrically insulating cover support detachably engaging structure of the electrical control component when the electrical control component is attached at a rear surface to a panel. The cover support presents a cover surface positioned in front of and having an opening providing access to electrically conducting elements of the electrical control component. An electrical insulating door is hingeably attached to the cover support to cover the opening when the door is in the closed position.

Thus, it is one object of the invention to provide a cover that reduces the chances that it will be misplaced or removed. The door may be opened for complete access while retaining attachment to the control component.

The electrically insulating door may be a transparent polymer material, for example, a polycarbonate such as Lexan.

Thus, it is another object of the invention to provide a cover that provides for visual inspection of the component prior to removal.

The electrically insulating cover support may also be a transparent polymer such as Lexan.

It is another object of the invention to provide improved illumination of the component and to simplify the construction and manufacture of the cover by making all parts of a single material.

The electrically insulating cover support and electrically insulating door may provide portions which together form a latch releasably holding the door in a closed position.

Thus, it is another object of the invention to allow the door to be stably held in a closed position reducing the chance of inadvertent contact with electrical components.

The latch and hinge may be integrally formed from the materials of the electrically insulating cover support and electrically insulating door.

Thus it is another object of the invention to provide a cover employing few parts (as few as two) and to allow all components of the cover to be, for example, insulating and transparent to provide the benefits of the material of the door and support.

The hinge may be at a side of the door to allow the door to open about a vertical axis.

Thus it is another object of the invention to provide a door which is naturally bi-stable remaining open or closed so as not to interfere with the inspection process nor require biasing springs or the like.

The invention may include an extensible shield attached to the door and vertically adjustable to provide an additional covering area of varying vertical extent. As before, the shield may be transparent such as manufactured from a polymer material like polycarbonate.

Thus, it is another object of the invention to provide a cover adaptable to a variety of different installation configurations of a particular control component.

The extensible shield may be held by electrically insulating connectors passing through at least one hole of a series of holes in the extensible shield and at least one hole in the door. The height of the extensible shield may be determined by selection of the hole of the series of holes in the extensible shield through which the insulating connectors are placed.

Thus it is another object of the invention to provide for a simple method of adjusting the size of the cover that may be performed in the field, for example, when a fuse block component is configured for different sizes of fuses.

The insulating cover support may detachably engage to the structure of the electrical component by means of side panels extending inward from the cover surface of the cover support about the electrical control component. In one embodiment, the side panels may include access cutouts.

Thus, it is another object of the invention to provide minimal interference with adjacent wiring needed for the control component.

The side panels may include holes engaging outwardly extending tabs on the electrical control component or may include inwardly extending fingers engaging holes in the electrical control component.

Thus it is another object of the invention to provide an attachment method that does not require the drilling or tapping of holes in the mounting panel such as would be difficult, time consuming, and raise the possibility of contaminating the control system with conductive metal fragments.

When holes are used in the side panels to attach it to the electrical control component, they may be adjacent to V-channels to align the side panels with the tabs on the control component prior to engagement of the holes with the tabs.

Thus, it is another object of the invention to allow simple engagement of the cover with the control component after it has been mounted on the panel and in situations of relatively low accessibility.

The electrically insulating cover may have legs extending inward from the cover surface about the electrical control component to abut a rear panel supporting the electrical control component to align the electrically insulating cover.

Thus, it is another object of the invention to provide a simple method of aligning the cover with the rear panel without requiring permanent attachment to the rear panel.

These particular objects and advantages may apply to only some embodiments falling within the claims and thus do not define the scope of the invention.

DETAILED DESCRIPTION OF THE PREFERRED EMBODIMENT

Figure 1:
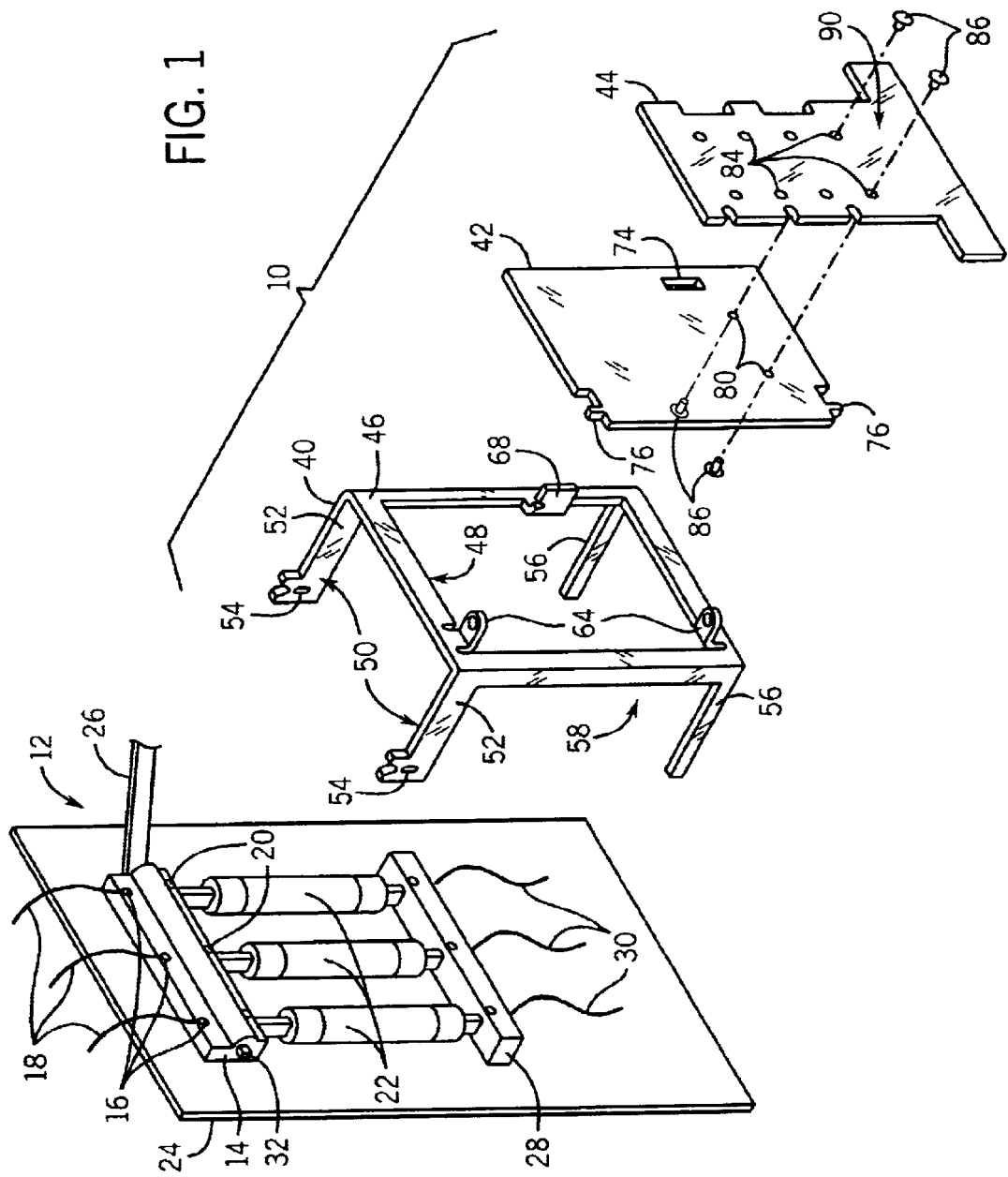
FIG. 1 is an exploded perspective view of an electrical disconnect with a trailing fuse block mounted on a panel showing positioning of the cover of the present invention including a cover support, a door, and a door extension.

Referring now to FIG. 1, the cover system 10 of the present invention is designed to work with a control component 12 such as an electrical disconnect with a trailing fuse block. In this example, the control component 12 includes an electrical disconnect portion 14 and a trailing edge fuse block portion 28.

The electrical disconnect portion 14 has terminals 16 for accepting power leads 18 from a three phase source and supports first fuse ferrule or blade holders 20 for holding one end of standard fuses 22. The electrical disconnect portion 14 may be attached to a mounting panel 24 such as may be contained in a cabinet according to techniques well known in the art.

A disconnect lever arm 26 may extend from the side of the electrical disconnect portion 14 allowing electrical connection and disconnection of the power leads 18 to the fuses 22. As is understood in the art, the disconnect lever arm 26 may be interlocked with a door handle mechanism (not shown) or the like to allow unhindered opening of the door of the enclosure only when the disconnecting means is opened. This interlock may be defeated so that power may be applied with the cabinet door open for routine maintenance.

Referring still to FIG. 1, the trailing edge fuse block portion 28 may be attached to the mounting panel 24 below the electrical disconnect portion 14 to receive a second end of the fuses 22 and provides for an electrical connection of power leads 30 to the second end of the fuses 22. The power leads 30 may pass to a piece of equipment to be controlled. The trailing edge fuse block portion 28 may be moved up and down on the mounting panel 24 depending on the size of the fuses 22 required.

Figure 4:
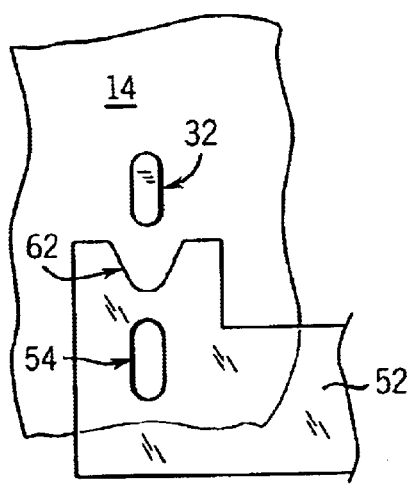
FIG. 4 is a side elevational view of a side panel of the cover support having a hole for engaging a corresponding tab on the electrical disconnect and a V-notch for helping the user to align the tab and hole.
Figure 5:
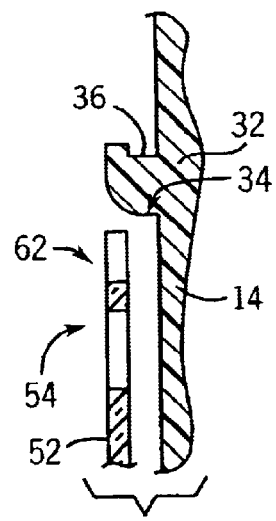
FIG. 5 is a side cross-sectional view similar to that of FIG. 4.

Referring to FIGS. 1, 4, and 5, a tab hook 32 may be molded in the left and right sides of the electrical disconnect portion 14 to extend outward therefrom generally parallel to the mounting panel 24. The tab hook 32 may have a lower ramp surface 34 and an upper hook portion 36 so as to provide a point of attachment for the cover system 10 as will be described below.

The cover system 10 includes a cover support 40, a door 42, and an optional extension 44 and rivets 86, each constructed of insulating material and preferably (all but the rivets 86) constructed of a transparent polycarbonate plastic sheet, such as Lexan, cut and folded as will be described.

When the cover system 10 is attached to the control component 12, the cover support 40 provides a front cover surface 46 generally parallel to the mounting panel 24 but positioned in front of the conductive components of the control component 12, for example, the fuses 22 toward the door of a cabinet. The front cover surface 46 includes a rectangular central aperture 48 allowing access to those conductive elements for the purposes of measurement and repair.

The front cover surface 46 of the cover support 40 is supported at the left and right sides by side panels 50 which extend rearward from the front cover surface 46 at right angles to cover the left and right side of the control component 12 when the cover support 40 is in place. Each side panel 50 includes an upper engagement arm 52 having an engagement hole 54 and its rear edge ends most removed from the front cover surface 46. Each side panel 50 also includes a lower standoff leg 56 generally parallel to upper engagement arms 52 but positioned at the lower edges of the front cover surface 46. An access cutout 58 separates lower standoff leg 56 from upper engagement arms 52.

Referring now to FIGS. 4 and 5, the engagement hole 54 in each upper engagement arm 52 is positioned beneath the point of a V-groove 62 cut in an upper edge of the upper engagement arm 52. The V-groove provides a large target so that the upper engagement arms 52 may be aligned with the tab hook 32 on the control component 12 for installation of the cover support 40 after the control component 12 is in place in a cabinet or the like when access is reduced. The installation may be accomplished by grasping the front cover surface and tipping its top edge back to position the upper engagement arms 52 below the tab hooks 32.

Once the tab hooks 32 are positioned at the point of the V-groove 62, upper engagement arms 52 are flexed outward slightly so as to allow the engagement hole 54 to slip over the tab hooks 32. An upward motion of the engagement arms 52 may provoke this outward flexing so that the upper edge of the V-groove 62 is pushed outward by the ramp surface 34 on the tab hook 32. The cover is intentionally designed with a width dimension less than the dimension on which it is attached so that the arms press inward to abut against the sides of the disconnect component and reduce the likelihood of unintentional removal from the equipment. The engagement hole 54 is sized to allow a slight pivoting about a horizontal axis around the tab hook 32 of the upper engagement arms 52 to assist in this location process.

Upper engagement arms 52 may then be rotated downward until the lower standoff legs 56 touch the mounting panel 24 at their distal edges aligning the front cover surface 46 to be substantially parallel to the mounting panel 24. Adjustment of the relative offset of the engagement holes 54 and lower standoff legs 56 from the front cover surface 46 allows the cover support 40 to be readily adapted to a variety of control components 12. It will be understood that the attachment of the cover support 40 is simple and fast and requires no drilling of holes into the mounting panel 24 such as would generate possible metallic fragments and contaminants which could affect the performance of other components 12 inside the control panel. In addition, there is no need to use any power tools to add holes, tapped, or otherwise, to secure the cover.

Figure 6:
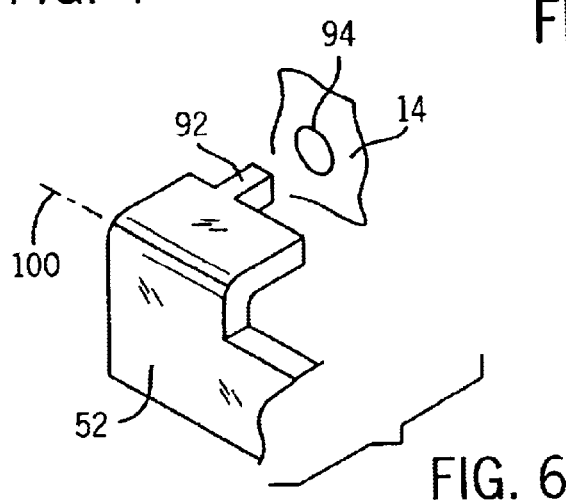
FIG. 6 is an alternative view of side panels of the cover support illustrating an alternative method of attaching the cover support to the control component 12.
Figure 7:
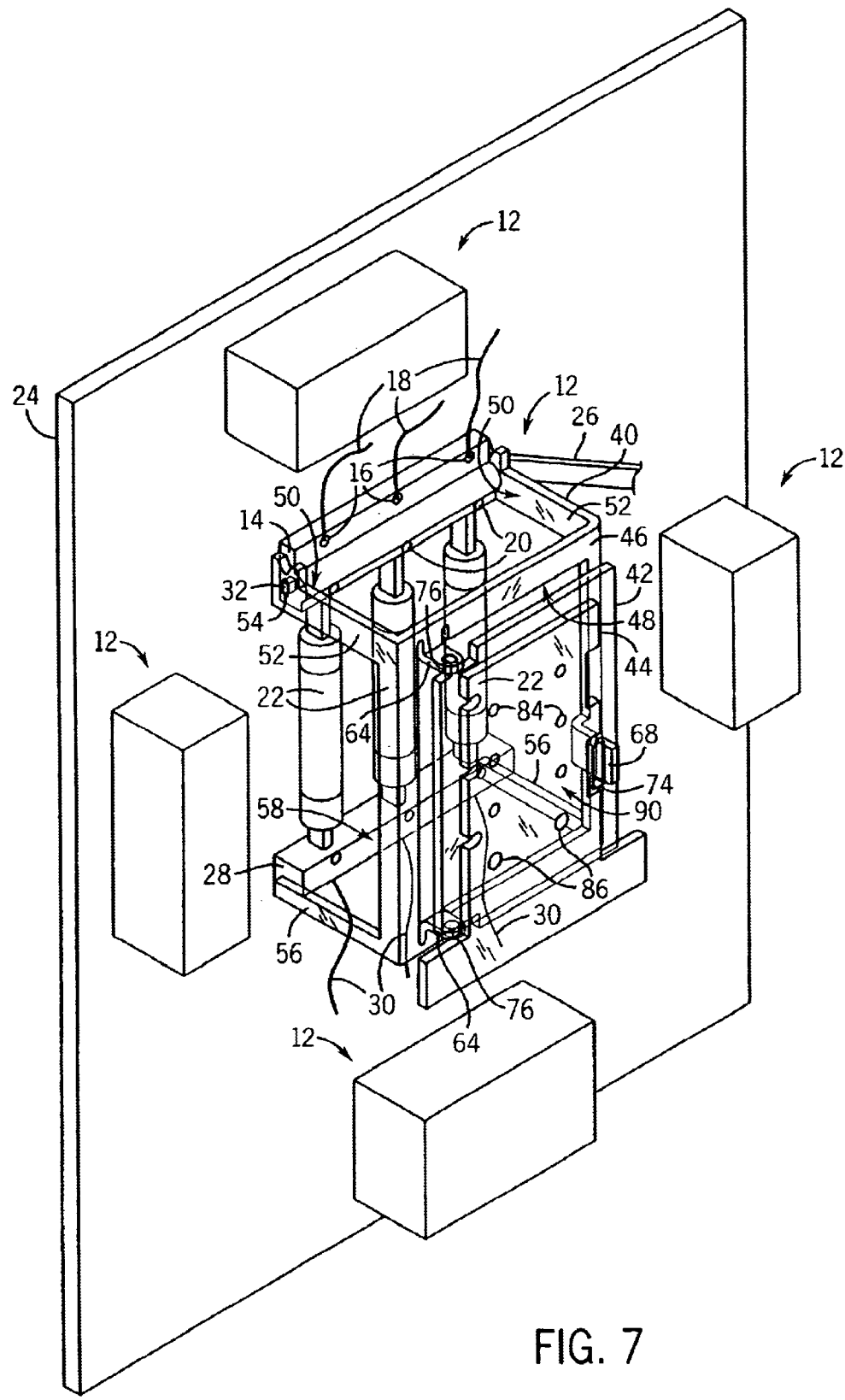
FIG. 7 is a perspective view of a plurality of control components mounted on a panel, and a cover support covering one of the control components.

Referring momentarily to FIG. 6 in an alternative embodiment, a hole 94 may be molded into the control component 12, or preexisting holes used for other purposes may be utilized, the holes receiving a tooth 92 formed in the end of each of the upper engagement arms 52. This tooth may be formed in a single planar thermoplastic sheet and then folded along line seam 100 in a manner described further below.

The engagement hole 94 and the tooth 92 allows a degree of rotation of the cover support 40, simplifying installation of the cover support 40 in tight quarters. The cover support 40 need not be parallel to the mounting panel 24 at the time of installation but may be angled into position and then rotated until the lower standoff legs 56 abut the front surface of the mounting panel 24.

Figure 2:
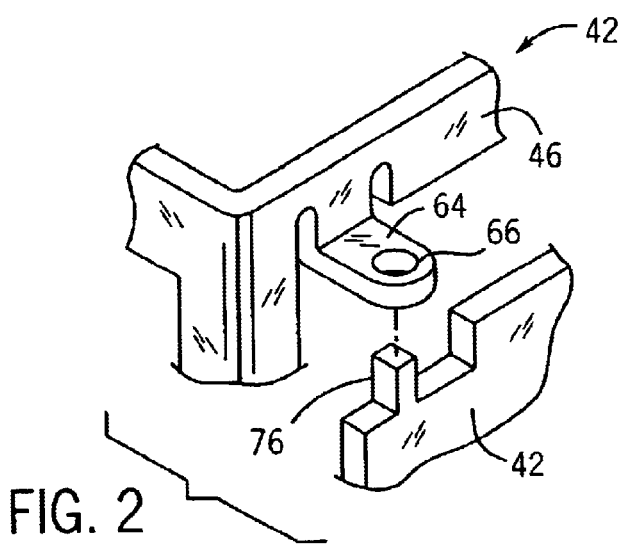
FIG. 2 is a detailed view of the hinge connecting the door and cover support showing its construction out of the same sheets of plastic used for the door and cover support.

Referring now to FIGS. 1 and 2, on the right side of the upper and lower horizontal edges of the central aperture 48 of the front cover surface 46, hinge tabs 64 may be formed having vertically aligned and opposed holes 66. When the cover support 40 is constructed of sheet polycarbonate plastic, these hinge tabs 64 may be cut to be cantilevered extensions into the central aperture 48 coplanar with the front cover surface 46. These extensions may then be heated and bent out horizontally using a bending fixture.

Figure 3:
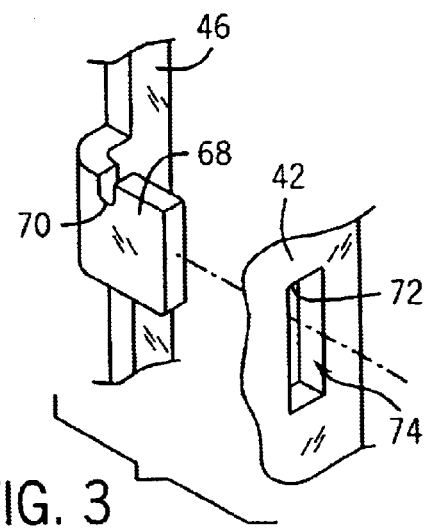
FIG. 3 is a view similar to FIG. 2 showing the formation of the latch from the same sheets of plastic used for the cover support and door.

Similarly referring to FIG. 3, at the center of the right vertical edges of the central aperture 48 of the front cover surface 46, a latch tab 68 may be formed extending frontward substantially perpendicular to the front cover surface 46. Again, this latch tab may be also cut as an extension into the central aperture 48 coplanar with the front cover surface 46 and may be heated and bent outward. Tab 68 may have a retention notch 70 extending vertically partway down from its upper edge such as may engage an upper edge 72 of a corresponding latch hole 74 cut in the door 42 as will now be described.

Door 42, at its left upper and lower left corners is notched to provide upper and lower hinge pins 76 extending vertically upward from the upper edge of the door 42 and vertically downward from the lower edge of the door 42. The hinge pins 76 are sized to fit within the hole 66 of the hinge tabs 64 and may be assembled therein by a slight flexing of either the door 42 and the front cover surface 46. In this way, hinges that are transparent, insulating, and integrally formed with the cover support 40 and door 42 are provided, to reduce the number of parts and simplify assembly.

Referring also to FIG. 3, a slight play in the fit between the hinge pins 76 and the holes 66 of the hinge tabs 64 allows a counter clockwise tipping of the door 42 allowing the edge 72 of latch hole 74 to rise over the tab 68 and drop into the notch 70 retaining the door in a closed position absent a slight upward lifting of the door 42 and outward pulling of the door.

When the door 42 is closed, the central aperture 48 is covered preventing inadvertent contact with conductive elements of the control components 12. Visual inspection of those elements can be conducted without opening a door 42, however, the door may be opened so as to allow the insertion of probes or optical monitoring using infrared thermography. Because the door 42 remains attached to the cover system 10 via the cover support 40, it is unlikely to be misplaced or discarded.

Good visibility of the contained control component 12 is provided by both the transparent material of the cover support 40 and the ample access cutout 58. The ability to see through the cover prior to its opening also assists in the prevention of unnecessary contact with the live circuitry.

An extension 44, being a planar sheet of transparent plastic in the preferred embodiment, may be fit to the door 42 to increase the area covered by the door 42. The door 42 may have a pair of horizontally displaced holes 80 in its lower surface. The horizontal separation of these holes 80 corresponds to the horizontal separation of a set of pairs of holes 84 spaced vertically on extension 44. By aligning particular ones of these pairs of holes 84 with the holes 80, and insertion of snap rivets 86 through the holes, the height of the extension 44 may be adjusted. The extension 44 may include an expanded section 90 at its lower edge wider than the door 42 that may be further tailored to the particular area of the control component 12 being covered. In the example of the electrical disconnect, expanded section 90 is sized to align substantially with the conductive portions of the trailing edge fuse block portion 28.

The rivets 86 may be well known snap-type plastic rivets having inter-engaging teeth so as to be pressed together to clamp the door 42 and extension 44 together.

It will be understood that the cover support 40, door 42, and extension 44 as described may be fabricated, for example, by cutting the necessary outlines and openings in one or more sheets of thermoplastic and then forming the sheet by bending it at the edges of the front cover surface 46 through heating and mechanical action. The forming of the hinge tabs 64 and latch tab 68 may be done by a low cost jig providing for the necessary shaping surfaces for bending the tabs after the material has been suitably heated. The simplicity of the manufacturing allows a wide variety of different cover systems to be developed simply by using different templates for cutting the various components of the cover support 40, door 42, and extension 44 from stock sheet. These templates may be implemented by data files stored on a computer-aided machine such as a milling machine. In this way, a variety of low cost covers may be manufactured in low volume on an as needed basis.

It is specifically intended that the present invention not be limited to the embodiments and illustrations contained herein, but include modified forms of those embodiments including portions of the embodiments and combinations of elements of different embodiments as come within the scope of the following claims.

We claim:

1. A cover system for a panel supporting a plurality of electrical control components, the cover system comprising:
   an electrically insulating cover support detachably coupled to a portion of the panel to cover at least one, but not all, of the electrical control components, the cover support presenting a cover surface having an opening for providing visibility of electrically conducting elements of the at least one electrical control component; and
   an electrically insulating door attached to the cover support and movable between an open and close position, wherein the door covers the opening when the door is in the closed position.

2. The cover system of claim 1 wherein the electrically insulating door is a transparent polymer material.

3. The cover system of claim 2 wherein the transparent polymer material is a polycarbonate sheet.

4. The cover system of claim 1 wherein the electrically insulating cover support is a transparent polymer.

5. The cover system of claim 4 wherein the transparent polymer material is a polycarbonate sheet.

6. The cover system of claim 1 wherein the electrically insulating cover support and electrically insulating door provide portions together forming a latch releasably holding the door in a closed position.

7. The cover system of claim 6 wherein the latch is integrally formed from the material of the electrically insulating cover support and electrically insulating door.

8. The cover system of claim 1 wherein the hinge is at a side of the door to allow the door to open about a vertical axis.

9. The cover system of claim 1 wherein the hinge is integrally formed from the material of the electrically insulating cover support and electrically insulating door.

10. The cover system of claim 1 further including an extension to the door that is vertically adjustable to provide a covering of electrical control components of varying vertical extent.

11. The cover system of claim 10 wherein extension is a transparent polymer.

12. The cover system of claim 10 wherein transparent polymer material is a polycarbonate sheet.

13. The cover system of claim 1 wherein the extension is held by electrically insulating connectors passing through at least one holes of a series of hole in the extensible shield and at least one hole in the door, wherein the height of the extension may be determined by selection of the hole of the series of holes in the extension through which the insulating connectors are placed.

14. The cover system of claim 13 wherein the covered electrical component is a disconnect with a trailing fuse holder and the holes are spaces according to variations in size of standard fuses.

15. The cover system of claim 1 wherein the insulating cover support detachably engages the covered electrical control components by means of side panels extending inward from the panel surface about the electrical control component.

16. The cover system of claim 1 wherein the cover support includes side panels having access cutouts.

17. The cover system of claim 16 wherein the side panels include holes engaging outwardly extending tabs on the covered electrical control component.

18. The cover system of claim 16 wherein the side panels includes V-channels aligned with the holes to align the side panels with the tabs prior to engagement of the holes with the tabs.

19. The cover system of claim 16 wherein the side panels include inwardly extending fingers engaging holes in the covered electrical control component.

20. The cover system of claim 1 wherein the electrically insulating cover further includes legs extending inward from the panel surface about the covered electrical control component to abut a rear panel supporting the electrical control component to align the electrically insulting cover.

21. The cover system of claim 20 wherein the engagement of the electrically insulating cover with the covered electrical control component allows pivoting of the electrically insulating cover about the engaging structure and wherein the legs abutting the rear panel serve to align the electrical insulating cover with respect to the rear panel.

22. The cover system of claim 1, wherein the cover support electrical control detachably engages the electrical control component via at least one standoff member when the electrical control component is attached at a rear surface to a panel.

23. The cover system of claim 1, wherein the cover support includes an integral engagement member mating with a corresponding engagement member of the electrical control component.

24. The cover system of claim 1, wherein the door is hingeably attached to the cover support.

25. A method of producing a cover system for an electrical control component of a type having an electrically insulating cover support detachably engaging with structure of the electrical control component when the electrical control component is attached to a panel, the electrically insulating cover support presenting a cover surface positioned in front of, and having an opening providing access to, electrically conducting elements of the electrical control component; and an electrically insulating door hingeably attached to the cover support to cover the opening when the door is in the closed position, the method comprising the steps of:
   a) cutting a sheet of thermoplastic to an outline of the electrically insulating cover support and electrical insulating door both as unfolded to a plane and including planar extending hinge tabs on the electrically insulating cover and planar extending hinge pins on the electrically insulating door;
   b) thermally forming the electrically insulating cover support to provide side panels flanking the cover surface extending backward from the cover surface and to bend the hinge tabs forward to receive the hinge pins of the electrically insulating door.

26. The method of claim 25 wherein the electrically insulating cover further includes a planar latch and the step of forming the electrically insulating cover support further bends the latch tab forward to receive a corresponding latch hole in the door.

27. The method of claim 25 wherein step a) is performed using a computer controlled milling machine executing cutting instructions and including the step of compiling a series of outlines for different control components and selecting the cutting instruction from the series.

28. A cover system for a panel supporting a plurality of control components, the cover system comprising:
   an electrically insulating cover detachably coupled to a portion of the panel to cover at least one, but not all, of the control components, the cover providing a surface positioned adjacent the at least one control component and spaced therefrom, the cover having an opening for providing access to electrically conducting elements of the at least one control component; and
   an electrically insulating door movably attached to the cover so as to close the opening when the door is in a first position and for providing access to the electrically conductive elements when the door is in a second position.

29. The cover system of claim 28 wherein the electrically insulating door is a transparent polymer material.

30. The cover system of claim 29 wherein the transparent polymer material is a polycarbonate sheet.

31. The cover system of claim 28 wherein the electrically insulating door support transparent polymer.

32. The cover system of claim 31 wherein the transparent polymer material is a polycarbonate sheet.

33. The cover system of claim 28 wherein the hinge is at a side of the door to allow the door to open about a vertical axis.

34. A cover system for a panel supporting a plurality of control components, the cover system comprising:
   a cover support formed at least in part from an electrically insulating material and including means for detachably engaging structuer associated with at least one, but not all, of the plurality of control components when the at least one component is installed for use, when attached, the portion of the cover formed from electrically insulating material providing shielding front surface positioned adjacent the at least one component, the front surface removed from the structure to provide a space disposed between the front surface and the at least one component, wherein the at least one component; and
   an electrically insulating door being formed of a transparent material and movably attached to the cover support so as to close the opening and provide visual access to the at least one electrical component when the door is in a closed position.

35. The cover system of claim 34 wherein the transparent polymer material is a polycarbonate sheet.

36. The cover system of claim 34 wherein the electrically insulating cover support is a transparent polymer.

37. The cover system of claim 36 wherein the transparent polymer material is a polycarbonate sheet.

38. The cover system of claim 34 wherein the hinge is at a side of the door to allow the door to open about a vertical axis.

* * * * *